United States Patent [19]

Schiff

[11] Patent Number: 4,912,773
[45] Date of Patent: Mar. 27, 1990

[54] COMMUNICATIONS SYSTEM UTILIZING A PILOT SIGNAL AND A MODULATED SIGNAL

[75] Inventor: Leonard N. Schiff, Lawrenceville, N.J.

[73] Assignee: General Electric Company, Schenectady, N.Y.

[21] Appl. No.: 420,832

[22] Filed: Sep. 21, 1982

[51] Int. Cl.⁴ .......................... H04B 1/00; H04B 7/00
[52] U.S. Cl. ....................................... 455/71; 455/74; 455/103
[58] Field of Search ................... 370/74; 455/71, 103, 455/105, 208, 260; 179/170 A

[56] References Cited

U.S. PATENT DOCUMENTS

| | | | |
|---|---|---|---|
| Re. 31,295 | 6/1983 | Haley et al. | 370/74 |
| 3,577,082 | 5/1971 | Lautier et al. | 455/71 |
| 3,683,279 | 8/1972 | Weinberg et al. | 455/71 |
| 3,701,852 | 10/1972 | Sluijter et al. | 370/74 |
| 3,872,381 | 3/1975 | Yamamoto et al. | 370/74 |
| 4,107,624 | 8/1978 | Turner | 455/208 |
| 4,191,923 | 3/1980 | Schelisch | 455/71 |
| 4,197,496 | 4/1980 | Hiyama | 370/74 |
| 4,209,748 | 6/1980 | Weber | 455/71 |
| 4,259,744 | 3/1981 | Junod et al. | 455/103 |
| 4,354,277 | 10/1982 | Crackel et al. | 455/208 |

FOREIGN PATENT DOCUMENTS

| | | | |
|---|---|---|---|
| 1260546 | 8/1968 | Fed. Rep. of Germany | 370/74 |
| 1285505 | 12/1968 | Fed. Rep. of Germany | 370/74 |

OTHER PUBLICATIONS

R. Bates et al., "L5 System: Signal Administration and Interconnection", Bell Sys. Tech. Jrnl., vol. 53, No. 10, Dec. 1974, pp. 2129–2145.

Primary Examiner—Theodore M. Blum
Attorney, Agent, or Firm—Marvin Snyder; James C. Davis, Jr.

[57] ABSTRACT

A transmitted signal includes a pilot signal, a plurality of information signals and a carrier signal modulated by a modulating signal related in frequency to the pilot signal frequency. At a receiving station, the carrier signal is demodulated and the demodulated signal is used to generate a reference signal to translate the frequencies of the recovered pilot signal and the plurality of information signals by an amount sufficient to correct for undesirable frequency shifts which have occurred in the transmitted signal.

16 Claims, 2 Drawing Sheets

COMMUNICATIONS SYSTEM UTILIZING A PILOT SIGNAL AND A MODULATED SIGNAL

The present invention relates generally to a communications system and, more particularly, to a communications systems which utilizes a pilot signal and a modulated signal.

The technique of single sideband (SSB) modulation is known to have certain desirable properties. For example, the SSB technique generally requires less bandwidth than other amplitude modulation techniques such as double sideband modulation. This is one reason why the SSB modulation technique is very recently being introduced into satellite and terrestrial microwave communications systems. SSB also can be advantageously used in a frequency division multiplex voice communication system. The single sideband multiplex signal group consists of a large group of voice channels which are frequency division multiplexed together at baseband with each voice channel modulated in single sideband format. Typically, the SSB frequency multiplexed group is then used to frequency modulate (FM) a carrier in preparation for transmission.

It has been found that it is not always necessary to transmit the frequency multiplexed, group via FM. There are some advantages obtained from transmitting such a group of signals via direct up conversion of the baseband signals. In the frequency domain this corresponds to translating a frequency division multiplexed baseband signal, which might occupy a frequency region of, for example, 0 to 5 MHz, to a region of say 6 GHz to 6 GHz plus 5 MHz. The frequency structure of the signal stays otherwise the same.

In certain satellite communications systems, the up link from an earth station to the satellite is provided at about 6 GHz, whereas the down link from the satellite to the receiver earth station is at a frequency of about 4 GHz. The baseband SSB frequency division multiplexed signal at the transmitter is up converted to a 70 MHz IF frequency, then up converted further to the 6 GHz region for transmission to the satellite transponder. For the down link, the signals are down converted to 4 GHz for transmission to the receiver earth station and then down converted to the 70 MHz IF region at the receiver and then finally down converted back to the baseband region. These several frequency translations generally utilize conventional mixers and local oscillators. The accuracy of these frequency translations depends to a large extent on the frequency stability of the local oscillators used with the mixers. These local oscillators are not completely stable and experience long term frequency drifts. As a result, a signal that was at, for example, 70 MHz at the transmitting earth station can be received in the IF section of the receive earth station at a frequency other than 70 MHz. The frequency uncertainty depends on the particular earth station design and satellite design, and can be as high as plus or minus 10 KHz.

A second yet less severe problem occurs as a result of another source of frequency translation, namely Doppler shift, when transmitting via satellite. Geosynchronous satellites, while nominally stationary, actually move around their stable position in space. Hence, with respect to either the transmitting or receiving station on the earth, the satellite has a velocity that varies as a function of time. For frequencies used in satellite transmissions in the 4 and 6 GHz band, the variation of frequency due to Doppler shift can be between 0 and 100 or 200 Hz.

In transmitting a single sideband multiplexed signal, the actual multiplexed signal has a number of pilot tones that are added to it for the demultiplex apparatus to be able to successfully separate the received signal. The most important pilot signal, however, is the 60 KHz pilot that is added to the multiplexed signal at the bottom of the baseband. This multiplexed signal normally has no other signal surrounding it in the frequency domain. If the signal which is down converted at the earth station receiver can be processed such that the 60 KHz pilot is within 1 or 2 Hz of the 60 KHz pilot signal actually used at the transmitting earth station, then all the other frequencies in the multiplex group can be made to be within the 1 or 2 Hz tolerance which the system requires In the normal FM transmission mode there is no problem in doing this, because while the FM carrier suffers from an unpredictable frequency translation, resulting from long term drift in oscillators and also from Doppler shift, the demodulated FM signal (that is, the baseband signal) does not suffer from the drift. The baseband signal is affected by Doppler shift. However, the Doppler shift on a 60 KHz pilot signal is generally less than 0.1 Hz and represents no real problem. In contrast to the FM transmission technique, in single sideband modulation using direct up conversion, each and every signal in the multiplexed group is frequency shifted due to both Doppler frequency shifts and long term frequency drift by total amounts that can reach as much as 10 KHz. Thus, in a communications system employing SSB techniques with direct up conversion for transmission, some means is desirable to correct frequency drifts in the system.

In a signaling system embodying the invention, there is transmitted a pilot signal at a given frequency, a plurality of information signals which occupy a certain band of frequencies separated from the given frequency, and a modulated carrier at a frequency which is separated from both the given frequency and the certain frequency band. The modulation which is impressed upon the carrier is derived from a signal which has a particular frequency relationship to the pilot signal. Frequency drift in the transmitted signals is compensated for at the receiving station by deriving from the demodulated carrier a reference signal, and using this reference signal to frequency shift the recovered pilot and information signals by the required amount.

Figure 1:
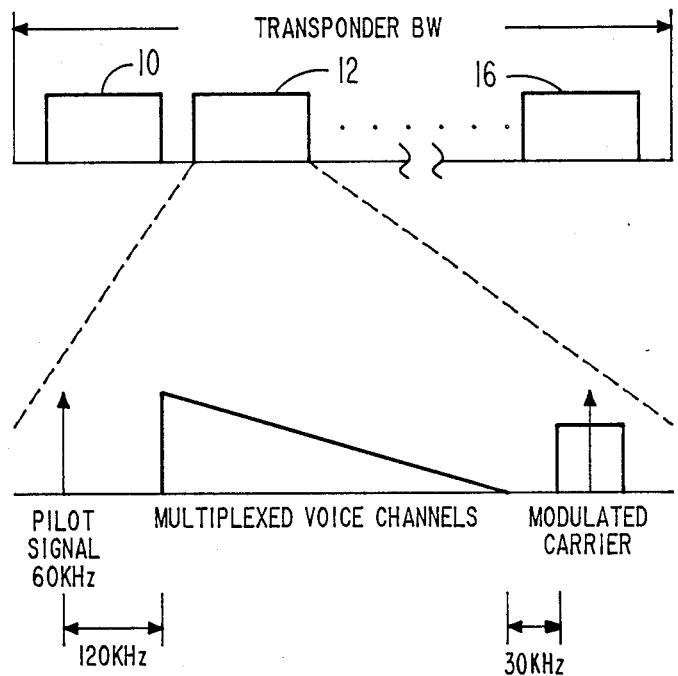
FIG. 1 is a frequency domain representation of the signaling format in accordance with the present invention.

The description of the present invention is provided in the context of a satellite communications system. FIG. 1, upper portion, is a representation of the frequency spectrum of the signals handled by the satellite transponder. The transponder bandwidth for a C band satellite communications system typically is on the order of 36 MHz. This bandwidth is taken up in the frequency region around 4 GHz for the down link from the satellite and around 6 GHz for the up link to the satellite. The transponder has several single sideband multiplexed signals occupying it such as 10, 12, . . . and 16. These signal sideband multiplexed signal groupings are separated from each other in frequency with enough guard band between them so that drifts in frequency do not cause the signals to overlap in frequency. Each of the multiplexed signal groupings within the transponder is made up of a number of signals. Grouping 12 is shown in the lower portion of FIG. 1. This signal grouping comprises a pilot signal which is very precisely held at 60 KHz at the transmitting station followed by the multiplexed voice channels beginning at about 120 KHz above the pilot signal at baseband. The multiplexed channels may comprise as many as 1800 voice channels, each having a bandwidth of about 4.1 KHz. In addition to the pilot signal and the multiplexed voice channels, a modulated carrier is provided. There is about 30 KHz of guard band provided between the upper end of the multiplexed channels and the lower end of the frequency band taken up by the modulated carrier. The frequency band of the modulated carrier is derived from Carson's Rule, i.e. B.W.=2 (fm+fp), where fp is the one sided peak deviation and fm is the frequency of the pilot (60 KHz) or sub-harmonic of the pilot depending on which is used. As explained earlier, the reason for the inclusion of the modulated carrier is that although the carrier frequency itself may drift due to drifts in local oscillators and Doppler shifts, the demodulated signal itself will only drift a small amount due to Doppler shift and will not be affected by large carrier drifts caused by local oscillator variations. Therefore, if the modulating signal can be stripped at the receiver and if that modulating signal is in fact related to the original pilot signal, then it can be used to recenter the entire band of frequencies such as 12 to within one or two cycles of the frequencies which were originally transmitted.

Figure 2:
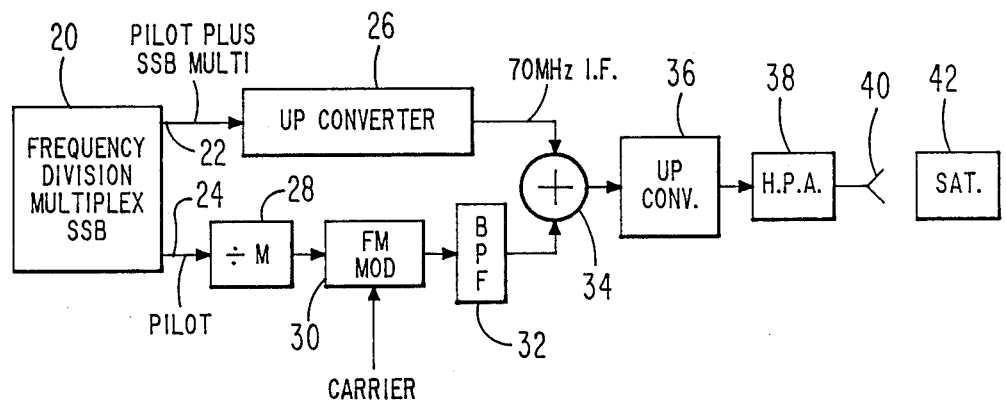
FIG. 2 is a block diagram of a transmitting station embodying the present invention.

FIG. 2 is a block diagram of a transmitter for the system under consideration. The block 20 marked "Frequency Division Multiplex SSB" is the standard apparatus for generating a multiplex of voice channels in the frequency domain, each voice channel being modulated by the SSB technique and including all of the standard pilot signals including the 60 KHz pilot signal. Output line 22 from block 20 provides the baseband single sideband multiplexed voice channels with the 60 KHz pilot added thereto. Output line 24 from block 20 provides the 60 KHz baseband pilot signal alone. The signal on line 22 is first up converted in frequency, by use of devices such as mixers and local oscillators, to an IF frequency in the 70 MHz area. The pilot signal on line 24 is divided in counter 28 by an integer M to create a sub-harmonic of the pilot signal. In some cases it may be desirable to use the pilot signal itself as the modulating signal and in these cases the integer M will be equal to 1. The sub-harmonic from divider 28 is then applied as a modulating signal to FM modulator 30.

The FM modulator 30 puts out a signal in the region of 70 MHz, the center frequency of the modulated signal being just above the top frequency of the multiplex group as shown in FIG. 1. The modulated signal is passed through a bandpass filter 32 to eliminate any spurious signals and is then applied as one input signal to adder 34. The other input signal to adder 34 is the pilot plus multiplexed channels in the IF range. This combined signal is now upconverted at 36 to the 6 GHz region in preparation for transmission to the satellite. The 6 GHz signal is then passed through a high power amplifier 38 and an antenna 40 which then transmits the signal to satellite 42.

In the satellite this combined signal along with the other signals received by the transponder from other earth stations, is translated to the 4 GHz band which is the standard frequency used for down link transmissions from a satellite communication system of the type described herein.

Figure 3:
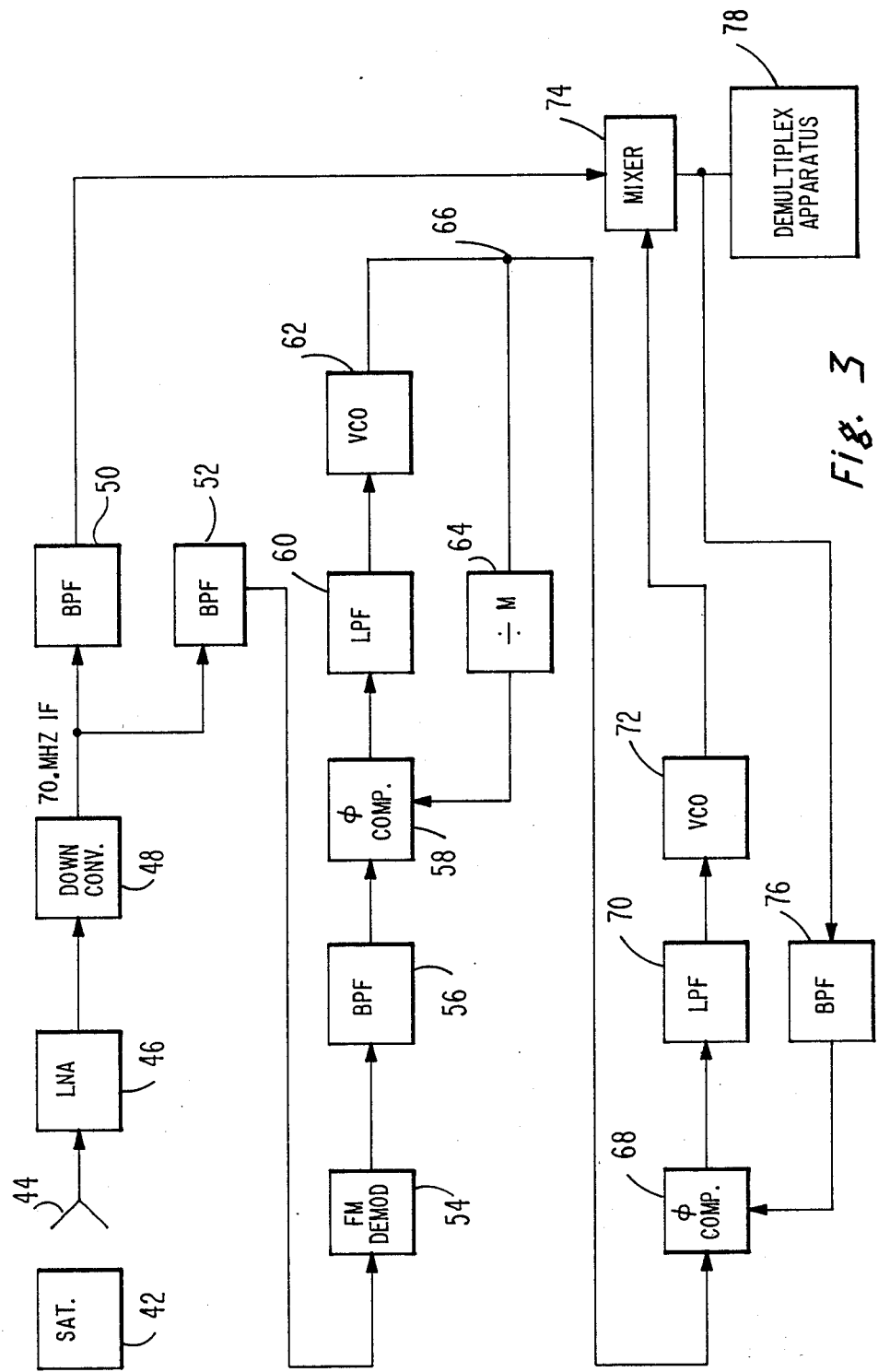
FIG. 3 is a block diagram of a receiving station for use with the present invention.

FIG. 3 shows apparatus located at the receiving earth station for accurately down converting the composite signals. The input to the apparatus from satellite 42 through receiving antenna 44 and low noise amplifier 46 is in the 4 GHz region. The signal from the low noise amplifier 46 is first down converted to the 70 MHz IF region at unit 48. This composite IF signal is now separated through the use of two bandpass filters 50 and 52. Bandpass filter 50 provides the pilot signal along with the multiplexed single sideband voice channel signals at the output thereof. Bandpass filter 52 provides, at its output terminal, the modulated carrier. The principle on which the receiver apparatus functions is to center the composite multiplex signal accurately in frequency by processing the modulated signal. It is desired to translate the frequency of the composite signal at the output of bandpass filter 50 by an amount such that the pilot signal, which was at 60 KHz when produced at baseband at the transmitter, is at a frequency very close to 60 KHz at the receiver station. The FM modulated carrier bears modulation at either the 60 KHz rate or a sub-harmonic thereof. The FM modulated signal is processed to extract a pilot signal frequency very close to 60 KHz. In fact, it differs from the 60 KHz pilot produced at the transmitter station only by the Doppler shift which is a small fraction of a Hertz. This 60 KHz reference pilot is used in the receive station to translate the multiplexed group in frequency until the pilot associated with the multiplexed group is locked in frequency to the 60 KHz reference signal derived at the receive station. When this is done, all the other frequencies in the multiplex group will have been similarly translated in frequency so that they are very close to where they were when originally transmitted.

The FM modulated carrier at the output of bandpass filter 52 is first demodulated in the FM demodulator 54. The demodulated signal is then bandpass filtered at 56 and applied as one input signal to a phase comparator 58. The output signal from phase comparator 58 is applied to low pass filter 60 which drives a voltage controlled oscillator (VCO) 62. The output signal from the VCO is divided by the integer M in counter 64 and is then applied as the second input to phase comparator 58. The phase lock loop comprising comparator 58 low pass filter 60, VCO 62 and divider 64 functions as a frequency tunable bandpass filter of very narrow bandwidth. When this loop acquires lock it provides an output signal at terminal 66 which is at the 60 KHz reference frequency and has a good signal to noise ratio. Thus, the signal at Junction 66 represents a reference frequency for the apparatus which is described later.

If the 60 KHz pilot signal itself is used to modulate the carrier, instead of a sub-harmonic of the pilot signal, it may be possible to dispense with the phase lock loop. This depends on being able to use a bandpass filter which is very narrow in bandwidth to keep the signal relatively free from spurious components and also at a center frequency that is quite stable so that the filter itself does not drift over long time periods. If these conditions can be met, the phase lock loop just described can be dispensed with in the case of direct pilot tone modulation. If these conditions cannot be met, then the phase lock loop arrangement without the divide by M counter can be used.

The reference signal at terminal 66 is used as one input signal to a quasi phase lock loop circuit. This quasi phase lock loop includes phase comparator 68, low pass filter 70, voltage controlled oscillator 72, mixer 74, and bandpass filter 76. This circuitry functions in the following manner. The single sideband multiplexed signal including the pilot signal, is fed into one input port of the mixer 74. The local oscillator port of that mixer, however, does not come from a fixed local oscillator but rather comes from voltage controlled oscillator 72. The output signal of the mixer process is then a translated version of the single sideband signal (translated to baseband). Bandpass filter 76, which is centered at 60 KHz, is used to extract the pilot portion of the signal at the output of mixer 74. That pilot portion is fed back to the second input of phase comparator 68 where it is compared to the 60 KHz reference pilot provided from terminal 66. The output of the phase comparator 68 then drives the low pass filter 70 which in turn drives the VCO 72. This arrangement differs slightly from a conventional phase lock loop apparatus and this loop network functions in effect only to lock the pilot coming from the output of mixer 74 to the receive station generated 60 KHz reference signal at the first input of phase comparator 68. When this locking is accomplished, the entire single sideband multiplexed signal has been translated to the proper frequency range.

For the reasons pointed out above, the loop comprising phase comparator 68, low pass filter 70, VCO 72, mixer 74, and bandpass filter 76 is a quasi phase lock loop. One of the consequences of the arrangement shown in FIG. 3, which differs from conventional phase lock loops, is that normally an increase in voltage out of the low pass filter driving the VCO in a phase lock loop will make the output frequency, which is fed back into the phase comparator, increase. In the case of FIG. 3, however, the VCO 72 drives a mixer 74 and an increase in frequency out of the VCO 72 will mean a reduction in frequency for the translated pilot signal at the output of mixer 74. Therefore, since the equivalent phase lock loop or quasi phase lock loop shown in FIG. 3 has a negative gain associated with it (that is, increases in VCO drive voltage produce decreases in frequency) the loop will come to lock at a point which is 180 degrees out of phase relative to a conventional phase lock loop arrangement. However, the phasing of the resulting output signal that is supplied to the demultiplexing equipment 78 is irrelevant in the case of FIG. 3. The important parameter is that the frequency of the pilot signal and the single sideband multiplexed channels is within one or two Hertz of the nominal value.

In the design of the receiver station shown in FIG. 3, it is desirable to keep the loop bandwidths as low as possible which is, in general, accomplished by increasing the loop gains. In the upper phase lock loop a low bandwidth will keep the reference frequency cleaner and in the lower quasi phase lock loop keeping the bandwidth narrow will partially suppress inadvertent frequency or phase noise on the signal caused by short term instability of the local oscillators in all the up and down converters the signal has passed through. The drawback to making the loop bandwidths too narrow however, is the fact that if the loops are out of lock it can take a long time to acquire the carrier, which is undesirable. This is not a problem in the upper phase locked loop where the signal coming from the FM demodulator is in a narrow bandwidth because only the Doppler shift operates on it. There is more of a problem in the lower phase lock loop equivalent, where the pilot frequency is in a band that may be as much as plus or minus 10 KHz wide. It may be necessary, therefore, in trying to provide very small loop bandwidth for the lower loop to introduce special circuitry to speed up acquisition time. These can be any of the standard methods. For example, when the loop is running out of lock, the gain of the loop can be low and as soon as carrier acquisition is obtained, the loop gain can be increased to narrow the loop bandwidth. Alternatively, another standard technique which may be employed here is to provide an extra signal port to the VCO 72 where the signal from the low pass filter is added to this input signal to drive VCO 72. This input signal is used only when the loop is running out of lock and is a slowly rising ramp voltage. When the ramp signal is applied, the effect is analogous to moving a narrow band filter slowly in center frequency. When the center frequency or free-running frequency is very close to the pilot frequency, then lock in takes place, in which case the amplitude of the voltage ramp is either frozen at the present value when lock is detected, or allowed to decay back to zero gradually. Both of these techniques can be used for the acquisition problem when the loop bandwidth is small.

What is claimed is:

1. In a single sideband signal transmission system, apparatus for formatting a main signal for transmission, said main signal including a pilot signal at a given frequency and a plurality of information signals occupying a certain band of frequencies separated from said given frequency and another signal, said apparatus comprising:

means for providing said pilot signal and a first signal comprising said pilot signal and said plurality of information signals;

modulation means responsive to said pilot signal for providing said other signal in the form of a modulated signal, said modulated signal resulting from the modulation of a signal related in frequency to said pilot signal onto a carrier at a frequency separated from said certain band of frequencies and said given frequency;

combining means for providing a combined signal comprising the addition of said first signal and said modulated signal; and means coupled to said combining means and responsive to said combined signal for providing said main signal to a transmission medium.

2. The apparatus according to claim 1 wherein said given frequency is lower than said certain band of frequencies.

3. The apparatus according to claim 2 wherein said means for providing said modulated signal comprises a frequency modulator and wherein said carrier frequency is higher than said certain band of frequencies.

4. The apparatus according to claim 3 wherein means for providing said modulated signal comprises a frequency divider responsive to said pilot signal for providing a sub-harmonic version of said pilot signal to said frequency modulator.

5. The apparatus according to claim 1 wherein said plurality of information signals are formatted into a frequency division multiplexed single sideband signal.

6. In a single sideband communications system for receiving a main signal comprising a pilot signal at a given frequency, a plurality of information signals occupying a certain band of frequencies separated from said given frequency and a modulated signal formed from a modulating signal related in frequency to said given frequency modulating a carrier at a frequency separated from both said given frequency and said certain band of frequencies, the apparatus comprising:

means for receiving said main signal from a transmission medium;

first filter means coupled to said receiving means for separating said pilot signal and said plurality of information signals from said main signal;

second filter means coupled to said receiving means for separating said modulated signal from said main signal;

demodulating means coupled to said second filter means for demodulating said modulated signal and for providing a reference signal at said given frequency;

frequency translation means having first and second input terminals and an output terminal, said first input terminal being connected to the output of said first filter means; and means responsive to said reference signal and to the pilot signal derived from signals at the output terminal of said frequency translation means for providing a translation signal at the second input terminal of said frequency translation means, the pilot signal and the information signals at the output terminal of said frequency translation means being translated in frequency under the control of said translation signal.

7. The apparatus according to claim 6 wherein said means responsive to said reference signal and to said pilot signal comprises:

a phase comparator responsive to said reference signal and to said pilot signal derived from said signals at said frequency translation means output terminal for providing a frequency correction signal; and a voltage controlled oscillator responsive to said frequency correction signal for providing said translation signal to said frequency translation means.

8. The apparatus according to claim 7 wherein said frequency translation means comprises a mixer.

9. The apparatus according to claim 8 wherein said given frequency is lower than said certain band of frequencies and said carrier is higher than said certain band of frequencies.

10. The apparatus according to claim 9 wherein said modulating signal is equal in frequency to said given frequency.

11. The apparatus according to claim 9 wherein said modulating signal frequency is a sub-harmonic of said given frequency.

12. The apparatus according to claim 11 wherein said demodulating and signal providing means comprises:

a demodulator responsive to said modulated signal for providing a demodulated signal at said sub-harmonic frequency; and a phase locked loop responsive to said demodulated signal at said sub-harmonic frequency for providing a reference signal at said given frequency.

13. In a single sideband communications system, the combination comprising:

transmitter means for providing a main signal to a transmission medium, said main signal comprising a pilot signal at a given frequency, a plurality of information signals in a certain frequency band above said given frequency and a modulated carrier at a frequency above said certain band, said carrier being modulated by a signal having a frequency related to said given frequency; and receiver means for recovering said main signal from said transmission medium and including:

means for separating said pilot signal and said plurality of information signals from said modulated carrier; demodulator means for demodulating said modulated carrier; and means for translating the frequency of said pilot signal and said plurality of information signals in accordance with a signal derived from said demodulator means.

14. The combination according to claim 13 wherein said plurality of information signals is arranged in a single sideband frequency division multiplex format in said main signal and wherein said carrier is frequency modulated.

15. The combination according to claim 14 wherein said carrier is modulated by a signal at said given frequency.

16. The combination according to claim 14 wherein said carrier is modulated by a signal at a sub-harmonic of said given frequency.

* * * * *